United States Patent
Mendes et al.

(10) Patent No.: US 10,448,155 B2
(45) Date of Patent: Oct. 15, 2019

(54) DEVICE FOR CONTROLLING A LOUDSPEAKER WITH CURRENT LIMITATION

(71) Applicant: DEVIALET, Paris (FR)

(72) Inventors: Eduardo Mendes, Chabeuil (FR); Frédéric Lepoutre, Paris (FR); Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 15/544,808

(22) PCT Filed: Jan. 19, 2016

(86) PCT No.: PCT/EP2016/050995
§ 371 (c)(1),
(2) Date: Jul. 19, 2017

(87) PCT Pub. No.: WO2016/116435
PCT Pub. Date: Jul. 28, 2016

(65) Prior Publication Data
US 2017/0366899 A1 Dec. 21, 2017

(30) Foreign Application Priority Data

Jan. 19, 2015 (FR) ...................... 15 50413

(51) Int. Cl.
*H04R 3/00* (2006.01)
*H04R 3/04* (2006.01)
(Continued)

(52) U.S. Cl.
CPC ............... *H04R 3/007* (2013.01); *H02H 9/02* (2013.01); *H03G 3/004* (2013.01); *H03G 7/007* (2013.01); *H03H 7/06* (2013.01); *H04R 3/04* (2013.01)

(58) Field of Classification Search
CPC . H04R 3/007; H04R 3/04; H02H 9/02; H03G 3/004; H03G 7/007; H03H 7/06
See application file for complete search history.

(56) References Cited

U.S. PATENT DOCUMENTS

| | | | | |
|---|---|---|---|---|
| 4,903,163 A | * | 2/1990 | Atwater | H02H 3/52 361/113 |
| 2005/0163324 A1 | * | 7/2005 | Neunaber | H03F 1/52 381/55 |

(Continued)

FOREIGN PATENT DOCUMENTS

JP  2009253955  10/2009

OTHER PUBLICATIONS

International Search Report for PCT/EP2016/050995, dated Apr. 13, 2016.

(Continued)

*Primary Examiner* — Sonia L Gay
(74) *Attorney, Agent, or Firm* — B. Aaron Schulman, Esq.; Stites & Harbison, PLLC

(57) ABSTRACT

This control device for controlling a loudspeaker (14) in a loudspeaker enclosure, comprises:
- an input for an audio signal to be reproduced;
- a supply output for supplying an excitation signal for the loudspeaker;
- the calculation means (26, 36, 38, 70, 71, 80, 90) for calculating, at each time instant (t), at least one predicted current ($i_{ref}(t)$) for the excitation signal for the loudspeaker (14) as a function of the audio signal.

It comprises an attenuator (71) that is capable of limiting the predicted current to a limited current value that is lower than a ceiling value by application, to the predicted current, of an attenuation gain which is a function of the predicted current.

9 Claims, 6 Drawing Sheets

(51) Int. Cl.
*H03G 3/00* (2006.01)
*H03G 7/00* (2006.01)
*H02H 9/02* (2006.01)
*H02H 7/06* (2006.01)
*H03H 7/06* (2006.01)

(56) References Cited

U.S. PATENT DOCUMENTS

2009/0257599 A1* 10/2009 Sand Jensen ............ H03F 1/52
                                                          381/55
2009/0268918 A1   10/2009 Solgaard et al.
2012/0154037 A1*  6/2012 Pfaffinger .............. H03G 7/007
                                                          330/129
2012/0237045 A1   9/2012 Mihelich et al.

OTHER PUBLICATIONS

Preliminary Search Report for FR 1550413, completed Nov. 17, 2015.
Written Opinion of the International Searching Authority for PCT/EP2016/050995, dated Apr. 13, 2016.

* cited by examiner

DEVICE FOR CONTROLLING A LOUDSPEAKER WITH CURRENT LIMITATION

The present invention relates to a control device for controlling a loudspeaker in a loudspeaker enclosure, comprising:
- an input for an audio signal to be reproduced;
- a supply output for supplying an excitation signal for the loudspeaker;
- the calculation means for calculating, at each time instant, at least one predicted current for the excitation signal for the loudspeaker as a function of the audio signal.

Most often the loudspeakers are supplied with voltage from the amplifier. Based on the sound signal to be broadcast, a voltage amplifier applies a voltage to the loudspeaker that is proportional to the sound signal to be reproduced.

The proportionality gain is given by the volume gain desired by the user and the voltage gain of the amplifier.

The current flowing through the loudspeaker, delivered by the amplifier, depends on the impedance of the loudspeaker. The instantaneous amplitude limitation of this current may be necessary in order to protect the amplifier and/or the loudspeaker. This limitation must be effected without introduction of audible artifacts of the sound signal broadcasted by the loudspeaker.

The methods proposed in the state of the art are most often based on a combination of active and/or passive electronic circuits. The passive circuits are not adjustable, do not allow for fine adjustment and control of the device and are subject to variations during the course of operation. The operational principle of these active and/or passive circuits consists, most often, of introducing a resistive element in series with the loudspeaker in order to reduce the current, thus also introducing additional losses in the system. This type of method requires the setting in place of additional electronic elements in the installation, thereby making it more expensive, more voluminous and susceptible to failures.

The methods are based on a model of the loudspeaker for, based on the voltage applied to the loudspeaker, estimating the current of the loudspeaker, then by means of comparison of this current with a predefined threshold value, reducing the voltage applied to the loudspeaker if the current surpasses this threshold value. This method is hampered by two problems. First of all, the loudspeaker is a complex dynamic electromechanical system and defining of the threshold value is a complex task. Then, under certain conditions, decreasing the voltage applied to the loudspeaker will have the effect of increasing the instantaneous current and not of reducing it.

Limitation devices for limitation of the voltage applied to the loudspeaker or of the displacement of the membrane (diaphragm) of the loudspeaker have been widely described in the literature. It involves devices that are known as compressors (attenuators), for the direct amplitude limitation, or devices using variable frequency filters controlled by the variable value to be limited, for the indirect amplitude limitation.

The limitation of the current thus imposes either a current sensor, or the current estimation means for estimation of the current based on the voltage and the limitation devices for limitation of the voltage applied to the loudspeaker. These devices are relatively complex and adversely affect the quality of sound reproduction, by correcting the voltage applied to the loudspeaker.

The objective of the invention is to provide for a satisfactory means of control for a loudspeaker, limiting the current applied to the loudspeaker that is simple to implement operationally.

To this end, the object of the invention relates to a control device for controlling a loudspeaker of the abovementioned type, characterised in that it comprises an attenuator that is capable of limiting the predicted current to a limited current value that is lower than a ceiling value by application, to the predicted current, of an attenuation gain which is a function of the predicted current.

According to some particular embodiments, the control device includes one or more of the following characteristic features:
- the attenuator is capable of applying an attenuation gain comprised between 0 and 1 which tends to 1 when the value of the limited current is lower than the ceiling value;
- the attenuation gain satisfies the following relations:

If $|i_{ref}(t)| > i_{max}(t)$ then $g_{att}(t) = i_{max}(t)/|i_{ref}(t)|$

If $|i_{ref}(t)| \le i_{max}(t)$ then $g_{att}(t) = g_{att}(t-T_s) + k \times (1 - g_{att}(t-T_s))$ where $g_{att}(t-T_s)$ is the value of the attenuation gain at the preceding calculation step, $T_s$ being the time separating two successive calculations;
    k is a constant that is included in $]0,1[$;
    $i_{max}(t)$ is the ceiling value for the current;
    $i_{ref}(t)$ is the predicted value for the current.
- the said device includes the calculation means for calculation of the voltage to be applied based on the current to be applied and the voltage to be applied depends on the value of the current limited;
- the said device includes, upstream of the calculation means for calculating the predicted current, a desired model that is capable of applying a filtering function defining the ratio of the amplitude of a desired signal over the amplitude of the input signal originating from the module as a function of the frequency and the desired model is capable of modifying the function based on filtering of the predicted current;
- the filtering function is such that for the frequencies that are lower than a cut-off frequency, the ratio of the amplitudes is a function converging to zero when the frequency tends to zero and the desired model is capable of modifying the cut-off frequency as a function of the predicted current;
- the desired model includes a filter centered on a predetermined frequency that is capable of decreasing the current in a desired frequency band around the predetermined frequency;
- the desired model is capable of modifying the gain of the filter as a function of the predicted current.

The invention will be better understood upon reading the description that follows, which is provided only by way of an example and made with reference to the drawings in which.

Figure 1:
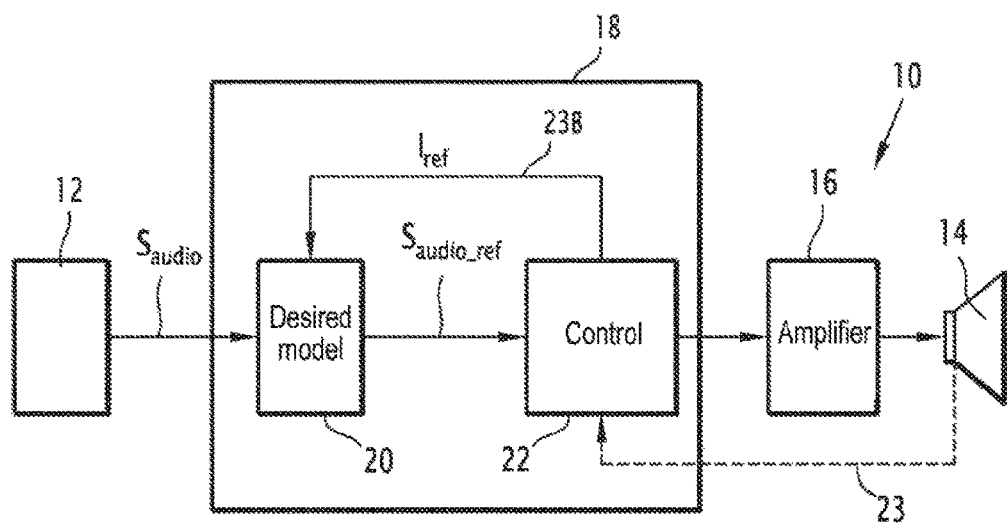
FIG. 1 is a schematic view of a sound reproduction installation.

The sound reproduction installation 10 illustrated in FIG. 1 includes, as is known per se, a signal production module 12 for producing an audio signal, such as a digital disk drive connected to a loudspeaker 14 of an enclosure through a voltage amplifier 16. Arranged between the audio source 12 and the amplifier 16 there is a control unit 18 including, successively in series, a desired model 20, corresponding to the desired model of behaviour of the loudspeaker enclosure, and a control device 22. This desired model is either linear or non-linear.

According to one particular embodiment, a measurement loop 23 for measuring a physical variable, such as the temperature of the magnetic circuit of the loudspeaker or the current intensity circulating in the coil of the loudspeaker is provided for between the loudspeaker 14 and the control device 22.

The desired model 20 is independent of the loudspeaker used in the installation and of its modelling.

Figure 2:
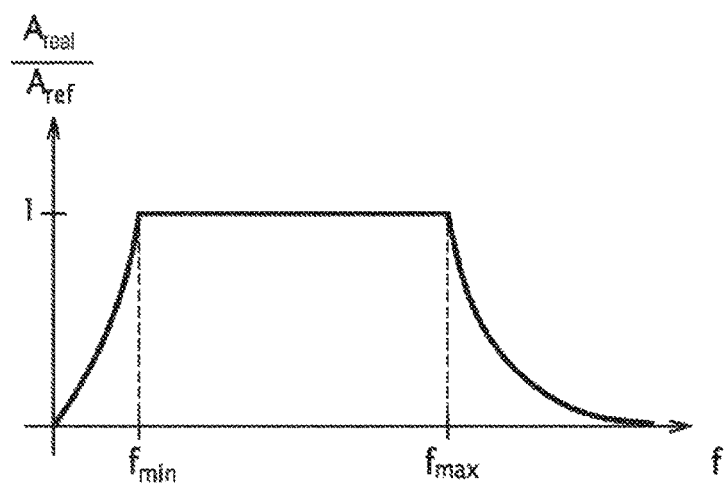
FIG. 2 is a curve illustrating a desired model of sound reproduction for the installation.

The desired model 20 is, as illustrated in FIG. 2, a function expressed as a function of the frequency of the ratio of the amplitude of the desired signal denoted $S_{audio\_ref}$ over the amplitude $S_{audio}$ of the input signal originating from the module 12.

Advantageously, for frequencies that are lower than a cut-off frequency $f_{min}$, this ratio is a function that converges to zero when the frequency tends to zero, in order to limit the reproduction of excessively low frequencies and thus to avoid displacement of the membrane (diaphragm) of the loudspeaker out of the ranges recommended by the manufacturer.

It is similarly the case for the high frequencies where the ratio tends to zero beyond a frequency $f_{max}$ when the frequency of the signal tends to infinity.

The desired model is capable of modifying on a continuous basis, that is to say, at each calculation step of the control device, the minimum $f_{min}$ cut-off frequency, as a function of a predicted current intensity $i_{ref}$ provided by the control device 22 through a link 23B as it will be described later, in particular with regard to FIG. 8.

Figure 3:
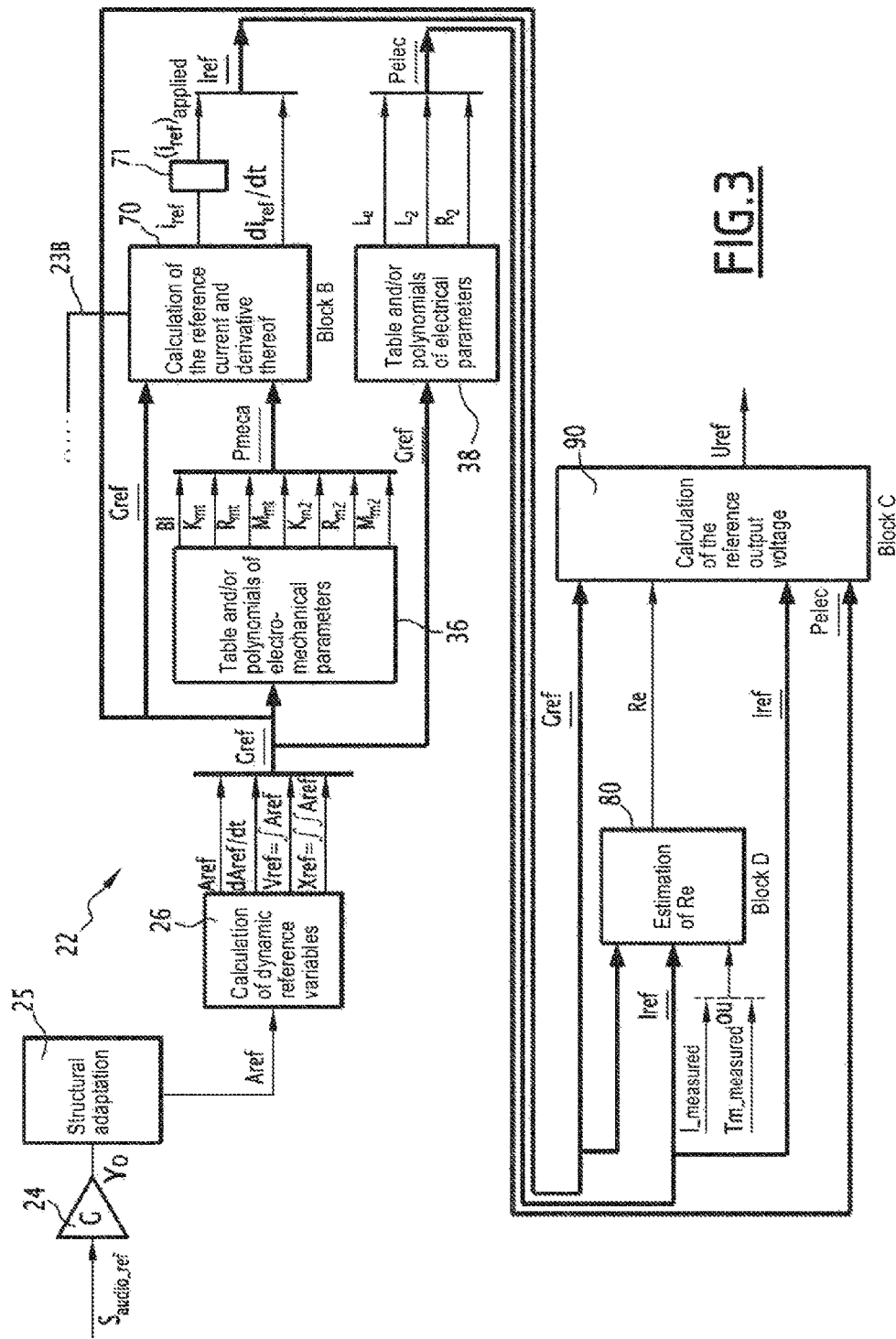
FIG. 3 is a schematic view of the control unit for controlling the loudspeaker.

The control device 22, of which the detailed structure is illustrated in FIG. 3, is disposed at the input of the amplifier 16. This device is capable of receiving as the input the audio signal $S_{audio\_ref}$ to be reproduced as defined upon being output from the desired model 20 and of providing as the output a signal $U_{ref}$ that forms an excitation signal for exciting the loudspeaker that is provided for amplification to the amplifier 16. This signal $U_{ref}$ is adapted so as to take into account the non-linearity of the loudspeaker 14.

The control device 22 includes the calculation means for calculating various different variables as a function of the values of derivatives or of integrals of other variables defined at the same time instants.

For the purposes of calculation, the values of the variables not known at the time instant n are taken to be equal to the corresponding values for the time instant n−1. The values for the time instant n−1 are preferably corrected by a prediction of 1st or 2nd order of their values by using the higher order derivatives known at the time instant n−1.

According to the invention, the control device 22 sets in operation a control using in part the principle of differential flatness which makes it possible to define a reference control signal for a differentially flat system based on sufficiently smooth reference trajectories.

As illustrated in FIG. 3, the control module 22 receives as input the audio signal $S_{audio\_ref}$ to be reproduced originating from the desired model 20. A unit 24 for application of a unit conversion gain, depending on the crest voltage of the amplifier 16, and on an attenuation variable between 0 and 1 controlled by the user, ensures the passage of the reference audio signal $S_{audio\_ref}$ to a signal $\gamma_0$, image of a physical variable to be reproduced. The signal $\gamma_0$ is, for example, an acceleration of the air next to the loudspeaker or even a speed of the air to be displaced by the loudspeaker 14. In the following sections, it is assumed that the signal $\gamma_0$ is the acceleration of the air set in motion by the loudspeaker enclosure.

At the output of the amplification unit 24, the control device includes a structural adaptation unit 25 for structural adaptation of the signal to be reproduced based on the structure of the enclosure in which the loudspeaker is used. This unit is capable of providing a desired reference variable $A_{ref}$ at each time instant for the membrane of the loudspeaker based on a corresponding variable, here the signal $\gamma_0$, for the movement of the air set in motion by the loudspeaker enclosure including the loudspeaker.

Thus, in this example considered, the reference variable $A_{ref}$, calculated based on the acceleration of the air to be reproduced $\gamma_0$, is the acceleration to be reproduced for the membrane of the loudspeaker in order to ensure that the operation of the loudspeaker imposes on the air an acceleration $\gamma_0$.

Figure 4:
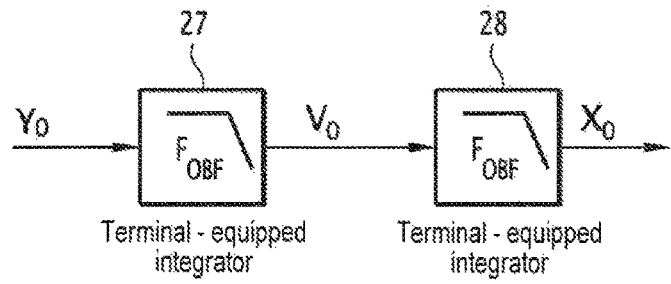
FIG. 4 is a detailed schematic view of the structural adaptation unit.

A detail of the structural adaptation unit 25 is illustrated in FIG. 4. The input $\gamma_0$ is connected to a terminal-equipped integration unit 27 whereof the output itself is connected to another terminal-equipped integration unit 28.

Thus, at the output of the units 27 and 28 are obtained respectively the first integral $v_0$ and the second integral $x_0$ of the acceleration $\gamma_0$.

The terminal-equipped integration units are formed of a first-order low-pass filter and are characterised by a cut-off frequency $F_{OBF}$.

The use of terminal-equipped integration unit makes it possible for the variables used in the control unit 22 to be derivatives or integrals of each other only in the useful bandwidth, that is to say, for the frequencies that are higher than the cut-off frequency $F_{OBF}$. This makes it possible to control the low frequency excursion of the variables considered.

In normal operation, the cut-off frequency $F_{OBF}$ is chosen in a manner so as to not influence the signal in the low frequencies of the useful bandwidth.

The cut-off frequency $F_{OBF}$ is taken to be less than one tenth of the frequency $f_{min}$ of the desired model 20.

In the case of a vented loudspeaker enclosure in which the loudspeaker is mounted in a box opened by a vent, the unit 25 produces the desired reference acceleration for the membrane $A_{ref}$ by means of the following relationship:

$$A_{ref} = \gamma_D = \gamma_0 + \frac{K_{m2}}{R_{m2}}v_0 + \frac{K_{m2}}{M_{m2}}x_0$$

With:
$R_{m2}$: acoustic leakage coefficient of the loudspeaker enclosure;
$M_{m2}$: inductance to the air mass in the vent;
$K_{m2}$: stiffness of the air in the loudspeaker enclosure;
$x_0$: position of the total air displaced by the membrane and the vent;

$$v_0 = \frac{dx_0}{dt}:$$

speed of the total air displaced by the membrane and the vent;

$$\gamma_0 = \frac{dv_0}{dt}:$$

acceleration of the total air displaced.

In this case, the reference acceleration desired for the membrane $A_{ref}$ is corrected or adjusted for structural dynamic variables $x_o$, $v_o$ of the loudspeaker enclosure, these latter being different from the dynamic variables relating to the membrane of the loudspeaker.

This reference variable $A_{ref}$ is introduced in a calculation unit 26 for calculating reference variables that is capable of providing, at every time instant, the value of the time derivative of the reference variable denoted as $dA_{ref}/dt$ as well as the values of the first and second integrals relative to time of this reference variable respectively denoted as $V_{ref}$ and $X_{ref}$.

All of the dynamic reference variables are denoted in the following sections as $G_{ref}$.

Figure 5:
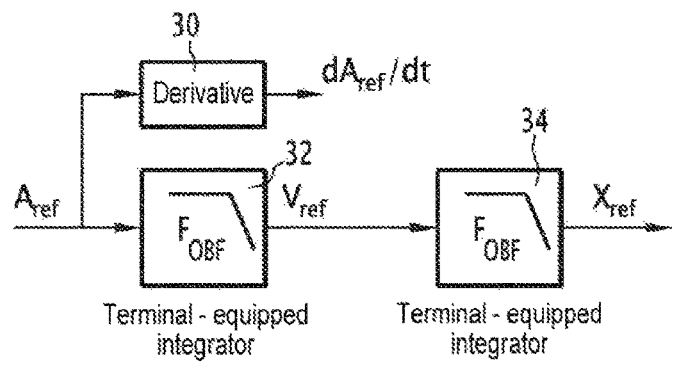
FIG. 5 is a detailed schematic view of the calculation unit for calculating of the dynamic reference variables.

In FIG. 5, a detail of the calculation unit 26 is illustrated. The input $A_{ref}$ is connected to a derivation unit 30 on the one hand and a terminal-equipped integration unit 32 on the other hand of which the output itself is connected to another terminal-equipped integration unit 34.

Thus, as output from the units 30, 32 and 34 are obtained respectively the derivative of acceleration $dA_{ref}/t$, the first integral $V_{ref}$ and the second integral $X_{ref}$ of acceleration.

The terminal-equipped integration units are formed by a first-order low-pass filter and are characterised by a cut-off frequency $F_{OBF}$.

The use of terminal-equipped integration unit makes it possible for the variables used in the control unit 22 to be derivatives or integrals of each other only in the useful bandwidth, that is to say, for frequencies that are higher than the cut-off frequency $F_{OBF}$. This makes it possible to control the low frequency excursion of the variables considered.

In normal operation, the cut-off frequency $F_{OBF}$ is chosen in a manner so as to not influence the signal in the low frequencies of the useful bandwidth.

The cut-off frequency $F_{OBF}$ is taken to be less than one tenth of the frequency $f_{min}$ of the desired model 20.

The control device 22 includes, in a memory storage, a table and/or a set of polynomials of the electromechanical parameters 36 as well as a table and/or a set of polynomials of the electrical parameters 38.

These tables 36 and 38 are capable of defining, as a function of the dynamic reference variables $G_{ref}$ received as input, the electromechanical parameters $P_{meca}$ and electrical parameters $P_{elec}$ respectively. These parameters $P_{meca}$ and $P_{elec}$ are obtained respectively from a mechanical modelling of the loudspeaker as is illustrated in FIG. 6, where the loudspeaker is assumed to be installed in a vented loudspeaker enclosure, and from an electrical modelling of the loudspeaker as is illustrated in FIG. 7.

The electromechanical parameters $P_{meca}$ include the magnetic flux that is captured by the coil denoted as BI produced by the magnetic circuit of the loudspeaker, the stiffness of the loudspeaker denoted as $K_{int}(x_D)$, the mechanical viscous friction of the loudspeaker denoted as $R_{int}$, the moveable mass of the whole loudspeaker assembly denoted as $M_{int}$, the stiffness of the air in the loudspeaker enclosure denoted as $K_{m2}$, the acoustic leakage of the loudspeaker enclosure denoted as $R_{m2}$ and the mass of air in the vent denoted as $M_{m2}$.

Figure 6:
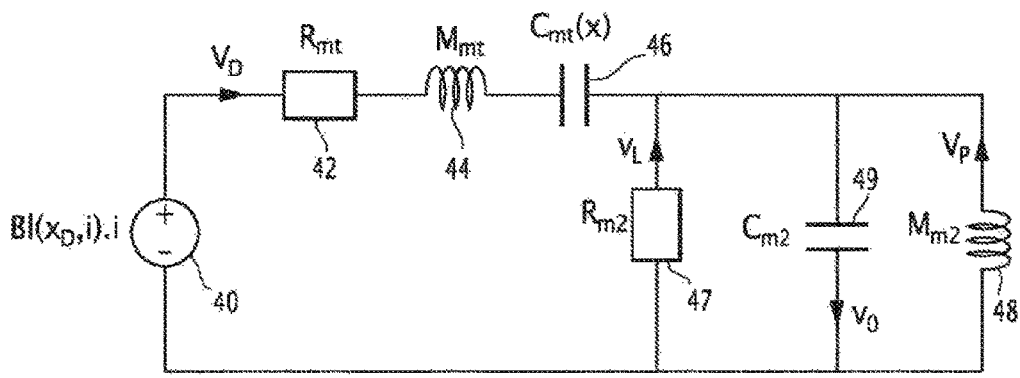
FIG. 6 is a view of a circuit representing the mechanical modelling of the loudspeaker with a view to effecting the control thereof in a loudspeaker enclosure equipped with a vent.
Figure 7:
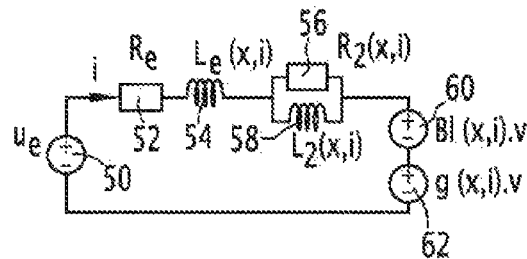
FIG. 7 is a view of a circuit representing the electrical modelling of the loudspeaker with a view to effecting the control thereof.

The modelling of the mechanical-acoustic part of the loudspeaker placed in a vented loudspeaker enclosure illustrated in FIG. 6 includes, in a single closed loop circuit, a voltage generator 40 $BI(x_D, i).i$ corresponding to the motor force produced by the current i flowing in the coil of the loudspeaker. The magnetic flux $BI(x_D, i)$ depends on the position $x_D$ of the membrane as well as on the current intensity i flowing in the coil.

This model takes into account the mechanical viscous friction $R_{int}$ of the membrane corresponding to a resistor 42 that is in series with a coil 44 corresponding to the whole moveable mass $M_{int}$ of the membrane, the stiffness of the membrane corresponding to a capacitor 46 of capacitance $C_{int}(x_D)$ equal to $1/K_{int}(x_D)$. Thus, the stiffness depends on the position $x_D$ of the membrane.

In order to take into account the vent, the following parameters $R_{m2}$, $C_{m2}$ and $M_{m2}$ are used:
$R_{m2}$: acoustic leakage coefficient of the loudspeaker enclosure;
$M_{m2}$: inductance equivalent to the air mass in the vent;

$$C_{m2} = \frac{1}{K_{m2}}:$$

compliance of the air in the loudspeaker enclosure.

In the modelling shown in FIG. 6, they respectively correspond to a resistor 47, a coil 48, and a capacitor 49 mounted in parallel.

In this model, the force originating from the reluctance of the magnetic circuit is disregarded.

The variables used are:

$$v_D = \frac{dx_D}{dt}: \text{ speed of the membrane of the loudspeaker;}$$

$$\gamma_D = \frac{dv_D}{dt}: \text{ acceleration of the membrane of the loudspeaker;}$$

$v_L$: air speed of air leaks;
$_pv$: speed of the air being output from the vent (port);

$$v_0 = \frac{dx_0}{dt} = v_D + v_L + v_P;$$

speed of the total air displaced by the membrane and the vent;

$$\gamma_0 = \frac{dv_0}{dt}: \text{acceleration of the total air displaced.}$$

The total acoustic pressure at 1 meter is given by:

$$p = \frac{\rho \cdot S_D}{n_{str}\pi} \gamma_0$$

where $S_D$: effective cross-section of the loudspeaker, $n_{str}=2$: solid angle of emission.

Figure 10:
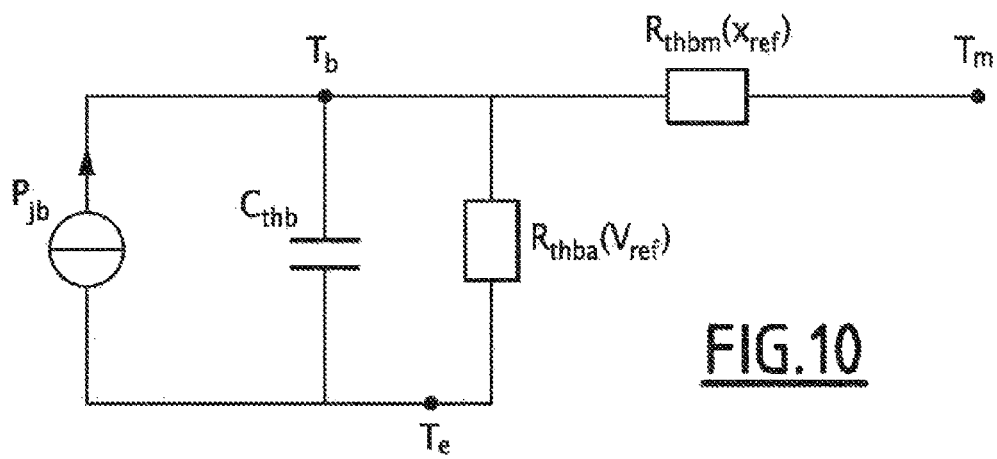
FIG. 10 is a view of a circuit of the thermal model of the loudspeaker.

The mechanical-acoustic equation corresponding to FIG. 10 is as follows:

$$Bl(x_D, i)i = M_{mt}\frac{dv_D}{dt} + R_{mt}v_D + K_{mt}(x_D)x_D + K_{m2}x_0$$

The following relation links the different variables:

$$\gamma_0 = \gamma_D - \frac{K_{m2}}{R_{m2}}v_0 - \frac{K_{m2}}{M_{m2}}x_0$$

The model of the electrical part of the loudspeaker is illustrated in FIG. 7.

The electrical parameters $P_{elec}$ include the inductance of the coil $L_e$, the para-inductance $L_2$ of the coil and the iron-loss equivalent $R_2$.

The model of the electrical part of the loudspeaker illustrated in FIG. 7 is formed by a closed loop circuit. It includes a generator 50 of electromotive force $u_e$ connected in series to a resistor 52 that is representative of the resistance $R_e$ of the coil of the loudspeaker. This resistor 52 is connected in series with an inductor $L_e(X_D, i)$ that is representative of the inductance of the coil of the loudspeaker. This inductance depends on the current intensity i flowing in the coil and on the position $x_D$ of the membrane.

In order to take into account the magnetic losses and variations in inductance as a resultant effect of Eddy currents, a parallel circuit RL is mounted in series at the output of the coil 54. A resistance 56 with value $R_2(x_D, i)$ dependent on the position of the membrane $x_D$ and on the current intensity i flowing in the coil is representative of the iron loss equivalent. In similar fashion, a coil 58 with inductance $L_2(x_D, i)$ also dependent on the position $x_D$ of the membrane and the current intensity i flowing in the circuit is representative of the para-inductance of the loudspeaker.

Also mounted in series in the model, are a voltage generator 60 producing a voltage $Bl(x_D, i).v$ that is representative of the counter-electromotor force of the coil in motion in the magnetic field produced by the magnet and a second generator 62 producing a voltage of $g(x_D, i).v$ with $$g(x_D, i) = i\frac{dL_e(x_D, i)}{dx_D}$$

representative of the effect of the dynamic variation of inductance with the position.

In a general manner, it should be noted that in this model, the flow Bl captured by the coil, the stiffness $K_{int}$ and the inductance of the coil $L_e$ depend on the position $x_D$ of the membrane, the inductance $L_e$ and the flow Bl also depend on the current i flowing in the coil.

Preferably, the inductance of the coil $L_e$, the inductance $L_2$ and the term g depend on the current intensity i, in addition to depending on the displacement $x_D$ of the membrane.

On the basis of the models explained with respect to FIGS. 6 and 7, the following equations are defined:

$$u_e = R_e i + L_e(x_D, i)\frac{di}{dt} + R_2(i - i_2) + Bl(x_D, i)v_D + i\underbrace{\frac{dL_e(x_D, i)}{dx_D}}_{g(x_D, i)} v_D$$

$$L_2\frac{di_2}{dt} = R_2(i - i_2)$$

$$Bl(x_D, i)i = R_{mt}v_D + M_{mt}\frac{dv_D}{dt} + K_{mt}(x_D)x_D + K_{m2}x_0$$

The control module 22 additionally also includes a calculation unit 70 for calculation of the reference current $i_{ref}$ and its derivative $di_{ref}/dt$. This unit receives as input the dynamic reference variables $G_{ref}$, the mechanical parameters $P_{meca}$, and the variables $x_0$ and $v_0$. This calculation of the reference current $I_{ref}$ and of its derivative $dI_{ref}/dt$ satisfies the two equations:

$$G_1(x_{ref}, i_{ref})i_{ref} = R_{mt}v_{ref} + M_{mt}A_{ref} + K_{mt}(x_{ref})x_{ref} + K_{m2}x_0$$

$$\frac{d}{dt}(G_1(x_{ref}, i_{ref})i_{ref}) = R_{mt}A_{ref} + M_{mt}dA_{ref}/dt + K_{mt}(x_{ref})v_{ref} + K_{m2}v_0$$

with $G_1(x_{ref}, i_{ref}) = Bl(x_{ref}, i_{ref}) - \frac{1}{2}i_{ref}\frac{dL_e(x_{ref}, i_{ref})}{dx}$.

Thus, the current $i_{ref}$ and its derivative $di_{ref}/dt$ are obtained by means of an algebraic calculation based on the values of the vectors entered by an exact analytical calculation or numerical solution if necessary based on the complexity of $G_1(x, i)$.

The derivative of the current $di_{ref}/dt$ is thus obtained preferably by an algebraic calculation or otherwise by numerical derivation.

In order to prevent the deterioration of the loudspeaker 14, by circulation of an excessively large current, the control unit 18 includes, on the one hand, the modification means for modifying the function of the desired model 20 as a function of the current $i_{ref}(t)$ predicted by the control device 22 transmitted through the connection 23B and, on the other hand, a current compression unit 71 for compressing the current $i_{ref}$ that is adapted in order to maintain the current $i_{ref}(t)$ being output from the unit 71 at a value $(i_{ref})_{applied}(t)$ that is lower than a maximum limit value $i_{max}(t)$.

The modification means for modifying the function of the desired model and the compression unit 71 are operationally implemented either in combination or only one of them is effectively implemented.

The compression unit 71 forms an attenuator by application of an attenuation gain $g_{att}(t)$. It is provided for at the output of the calculation unit 70 for calculation of the current as illustrated in FIG. 3.

Figure 8:
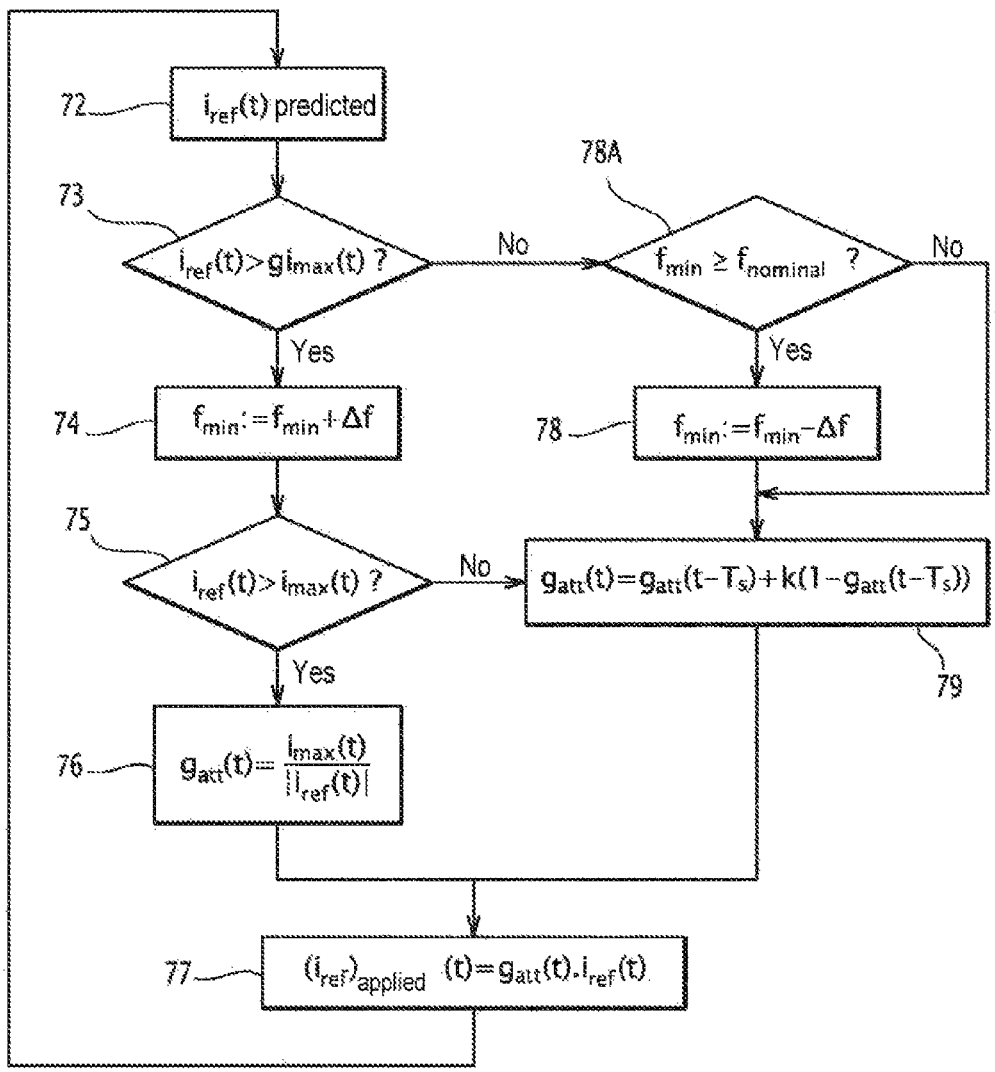
FIG. 8 is a flow chart of the limitation algorithm for limiting the current flowing in the coil of the loudspeaker.

For the limiting of the current $i_{ref}(t)$ and thus the calculation of the current $(i_{ref})_{applied}(t)$, the algorithm presented in FIG. 8 is effectively executed by the control unit 18.

During a step 72, the current $i_{ref}(t)$ predicted by the reference current calculation unit 70 is provided to the desired model 20 and to the compression unit 71. This current depends on the time as explained previously. It is provided for each calculation step of the calculation unit 70.

In the step 73, the current $i_{ref}(t)$ is compared to a fraction $g.i_{max}(t)$ of the maximum permissible current $i_{max}(t)$ by the loudspeaker. The coefficient g is a value comprised between 0 and 1 that is established at the time of designing the unit 18.

If the reference current $i_{ref}(t)$ is higher than $g.i_{max}(t)$ then, the desired model 20 is modified, in particular by progressively increasing the minimum cut-off frequency $f_{min}$ of the desired model illustrated in FIG. 2. The desired model is modified progressively during the step 74 with a relatively slow speed appropriate for rendering inaudible the changes in cut-off frequency.

Thus, in the example considered, the minimum frequency $f_{min}$ is increased by a value $\Delta f$ at every calculation step for calculating a new value $i_{ref}(t)$ by the control unit 22.

By way of a variant, the desired model 20 includes a filter centered on a predetermined frequency (known as peak-notch per the accepted English terminology) that is capable of reducing the current in a desired frequency band around the predetermined frequency band.

In this case, the gain of the filter is adjusted in the desired frequency band based on the reference current $i_{ref}(t)$. During the step 74, the gain of the filter is decreased in increments at a determined rate in a manner so as to render inaudible the variations in gain of the filter.

According to the invention, a variation of the minimum cut-off frequency $f_{min}$ and a variation of the gain of the filter are effectively brought about simultaneously or independently of one another according to the embodiment that is operationally implemented.

During the step 75, the value of the reference current $i_{ref}(t)$ is compared to the maximum current value $i_{max}(t)$.

If $i_{ref}(t)$ is higher than $i_{max}(t)$, an attenuation gain $g_{att}(t)$ is calculated in the step 76. The attenuation gain $g_{att}(t)$ is given by the formula $$g_{att}(t) = i_{max}(t)/|i_{ref}(t)|$$

During the subsequent step 77, the limited reference current value $(i_{ref})_{applied}(t)$ is calculated as the product of the attenuation gain $g_{att}(t)$ previously calculated by the reference current $i_{ref}(t)$ by means of the formula $$(i_{ref})\text{applied}(t) = g_{att}(t) \times i_{ref}(t)$$

The reference current value $(i_{ref})^{applied}(t)$ is subsequently used for the calculation of the reference output voltage $U_{ref}$ which will be amplified and applied to the terminals of the loudspeaker 14.

At the end of the step 77, the step 72 is once again carried out with the new reference current $i_{ref}(t)$ predicted during the subsequent step by the control device 22.

During the step 73, if the value of the reference current $i_{ref}(t)$ is lower than $gi_{max}(t)$, then the step 78 aimed at reducing the cut-off frequency of the desired model is implemented, if during the test carried out in the step 78A, the current cut-off frequency $f_{min}$ is higher than a nominal frequency $f_{nominal}$. The step 78, opposite of the step 74 of increasing of the minimum cut-off frequency, subtracts from the current cut-off frequency $f_{min}$ the increment $\Delta f$ appropriate to ensuring a progressive gradual descent of the cut-off frequency, as long as the reference current remains lower than the fraction of the maximum current $gi_{max}(t)$ and the cut-off frequency $f_{min}$ has not reached its nominal value $f_{nominal}$.

In one embodiment where the gain of a filter is modified during the step 74, the gain of the filter is increased by one pitch during the step 78.

At the conclusion of the step 78 or if the test of step 78A is negative, a new attenuation gain $g_{att}(t)$ is calculated in the step 79 based on the prior attenuation gain $g_{att}(t-Ts)$ calculated during the preceding step in order to allow for a progressive rise of the gain at a rate dependent on a parameter k. The gain $g_{att}(t)$ is calculated according to the following formula:

$$g_{att}(t) = g_{att}(t-{}_sT) + k \times (1-g_{att}(t-T_s))$$

where $g_{att}(t-Ts)$ is the value of the attenuation gain at the preceding calculation step, Ts being the time between two successive calculations;

k is a constant that is included in ]0,1[;

$i_{max}(t)$ is the ceiling value for the current;

$i_{ref}(t)$ is the predicted value for the current.

This same step 79 is effectively implemented if, at the end of the test of step 75, the reference current $i_{ref}(t)$ is lower than the current $i_{max}(t)$.

After calculation of the new attenuation gain $g_{att}(t)$, a new calculation of the applied reference current $i_{ref}(t)$ is carried out in the step 77 based on the new attenuation gain.

It is conceivable that the predictive calculation of the reference current $i_{ref}(t)$ makes possible the taking into account of this reference current for the modification of the desired model, and for the calculation of a value for an applied limit reference current $(i_{ref})_{applied}(t)$ limited in order to prevent the circulation of an extremely high current in the loudspeaker 14.

The presence of the compression unit for compression 71 applied to the reference current $i_{ref}$ avoids the implementation of a current sensor as well as the implementation of elements capable of reducing the voltage of the loudspeaker 14 by an additional resistor.

In addition, the control device 22 includes an estimation unit 80 for estimation of the resistance $R_e$ of the loudspeaker. This unit 80 receives as input the dynamic reference variables $G_{ref}$, the intensity of the reference currents $(i_{ref})_{applied}$ and its derivative $d(i_{ref})_{applique}/dt$ and, depending on the embodiment envisaged, the temperature measured on the magnetic circuit of the loudspeaker denoted as $T_{m\_mesured}$ or the current intensity measured through the coil denoted as $I_{m\_mesured}$.

Figure 9:
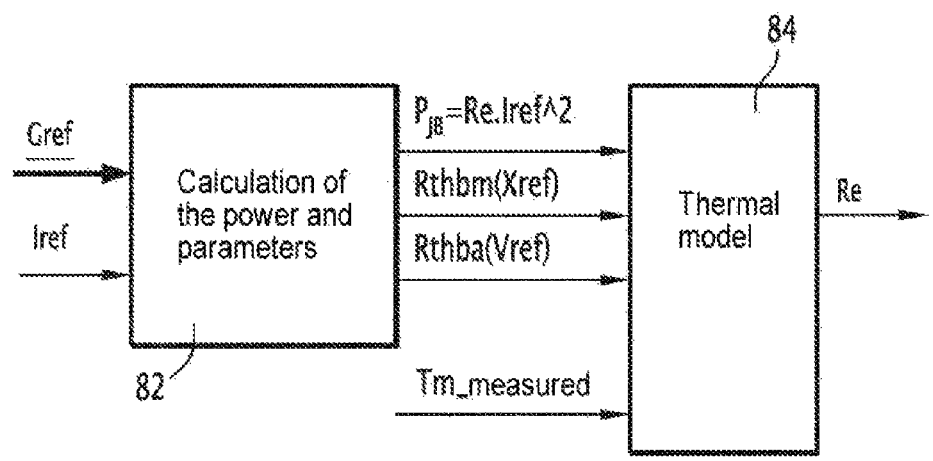
FIG. 9 is a schematic view of a first embodiment of the open loop estimation unit of the resistor of the loudspeaker.

In the absence of measurement of the circulating current, the estimation unit 80 is of the form illustrated in FIG. 9. It includes at the input a calculation module 82 for calculation of the power and parameters and thermal model 84.

The thermal model 84 ensures the calculation of the resistance $R_e$, based on the calculated parameters, the determined power and the measured temperature $T_{m\_mesured}$.

FIG. 10 gives the general diagram used for the thermal model.

In this model, the reference temperature is the temperature of the internal air of the loudspeaker enclosure $T_e$.

The temperatures considered are:

$T_b$ [° C.]: temperature of the coil winding;

$T_m$ [° C.]: temperature of the magnetic circuit; and $T_e$ [° C.]: internal temperature of the loudspeaker enclosure assumed to be constant or, ideally, measured.

The thermal power considered is:

$P_{Jb}$ [W]: thermal power provided to the coil winding due to the Joule effect;

As illustrated in FIG. 9, the thermal model includes the following parameters:

$C_{tbb}$ [J/K]: thermal capacity of the coil winding;

$R_{thbm}$ [K/W]: equivalent thermal resistance between the coil winding and the magnetic circuit; and $R_{thba}$ [K/W]: equivalent thermal resistance between the coil winding and the internal temperature of the loudspeaker enclosure.

The equivalent thermal resistances take into account the dissipation of heat by conduction and convection.

The thermal power $P_{Jb}$ provided by the current flowing in the coil winding is given by:

$$P_{Jb}(t) = R_e(T_b)i^2(t)$$

where $R_e(T_b)$ is the value of the electrical resistance at the temperature $T_b$:

$$R_e(T_b) = R_e(20°\,C.) \times (1 + 4.10^{-3}(T_b - 20°\,C.))$$

where $R_e(20°\,C.)$ is the value of the electrical resistance at 20° C.

The thermal model given in FIG. 9 is as follows:

$$C_{thb}\frac{dT_b}{dt} = \frac{1}{R_{thbm}(X_{ref})}(T_m - T_b) + \frac{1}{R_{thba}(V_{ref})}(T_e - T_b) + P_{Jb}$$

The solution thereof makes it possible to obtain the value of the resistance $R_e$ at each time instant.

Figure 11:
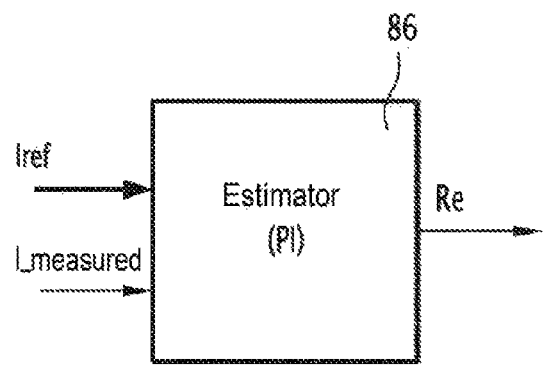
FIG. 11 is a view that is identical to that in FIG. 9 of a variant of the embodiment of the closed loop estimation unit of the resistor of the loudspeaker.

By way of a variant, as illustrated in FIG. 11, when the current i flowing through the coil is measured, the estimation of the resistance $R_e$ is performed by a closed loop estimator, of proportional integral type for example. This makes it possible to obtain a rapid convergence time by making use of a proportional integral corrector.

Finally, the control device 22 includes a calculation unit 90 for calculation of the reference output voltage $U_{ref}$ based on the dynamic reference variables $G_{ref}$, the applied reference current $(i_{ref})_{applied}$ and its derivative $d(i_{ref})_{applied}/dt$, the electrical parameters $P_{elec}$ and the resistance $R_e$ calculated by the unit 80. This calculation unit for calculation of the reference output voltage effectively uses the following two equations:

For reasons of simplification $(i_{ref})_{applied}$ is denoted as $i_{ref}$ in the following expressions:

$$u_2 + \frac{L_2(x_{ref}, i_{ref})}{R_2(x_{ref}, i_{ref})}\frac{du_2}{dt} = L_2(x_{ref}, i_{ref})\frac{di_{ref}}{dt}$$

$$u_{ref} = R_e i_{ref} + L_e(x_{ref}, i_{ref})\frac{di_{ref}}{dt} + u_2 + \frac{Bl(x_{ref}, i_{ref})v_{ref} + i_{ref}\frac{dL_e(x_{ref}, i_{ref})}{dt}v_{ref}}{g(x_{ref}, i_{ref})}$$

In the event that the amplifier 16 is a current amplifier and not a voltage amplifier as previously described above, the units 38, 80 and 90 of the control device are eliminated and the reference output current intensity $i_{ref}$ commanding the amplifier is taken as output of the unit 70.

Figure 12:
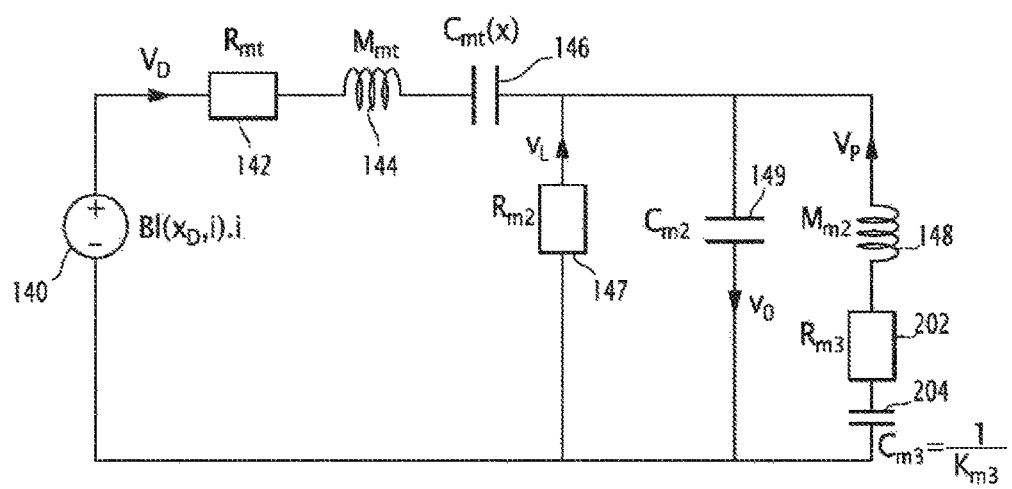
FIG. 12 is a view that is identical to that in FIG. 6 of another embodiment for a loudspeaker enclosure equipped with a passive radiator.

In the case of a loudspeaker enclosure comprising a passive radiator formed by a membrane, the mechanical model of FIG. 6 is replaced by that represented in FIG. 12 in which the elements identical to those in FIG. 6 bear the same reference numbers. This module includes in series with the coil $M_{m2}$ 48, corresponding to the mass of the membrane of the passive radiator, a resistor 202 and a capacitor 204 of value $$C_{m3} = \frac{1}{K_{m3}}$$

corresponding respectively to the mechanical losses $R_{m2}$ of the passive radiator and to the mechanical stiffness $K_{m3}$ of the membrane of the passive radiator. The reference acceleration of the membrane $A_{ref}$ is given by:

$$A_{ref} = \gamma_0 + \frac{K_{m2}}{R_{m2}}v_0 + \frac{K_{m2}}{M_{m2}}x_{0R}$$

with $x_{OR}$ given by filtering through a high pass filter of $x_0$:

$$x_{0R} = \frac{s^2}{s^2 + \frac{R_{m3}}{M_{m2}}s + \frac{K_{m3}}{M_{m2}}}x_0$$

Thus, the structural adaptation structure 25 will include in series two terminal-equipped integrators for the obtaining of $v_0$ and $x_0$ based on $\gamma_0$, then the calculation of $x_{OR}$ from $x_0$ by high-pass filtering with the additional parameters $R_{m3}$ and $K_{m3}$ which are respectively, the resistance of mechanical losses and the mechanical stiffness constant of the membrane of the passive radiator.

The invention claimed is:

1. A control device for controlling a loudspeaker in a loudspeaker enclosure, comprising:
   an input for an audio signal to be reproduced;
   a supply output for supplying an excitation signal for the loudspeaker;
   a calculation assembly comprising a set of units, said calculating assembly calculating, at each time instant, at least one predicted current for the excitation signal for the loudspeaker as a function of the audio signal;
   wherein said calculation assembly comprises an attenuator that is capable of limiting the predicted current to a limited current value that is lower than a ceiling value by application, to the predicted current, of an attenuation gain which is a function of the predicted current, said attenuator being a unit of the calculation assembly; and
   wherein said calculation assembly includes a calculation unit that calculates the voltage to be applied based on the current to be applied, and wherein the voltage to be applied depends on the value of the current limited.

2. A device according to claim 1, wherein the attenuator is capable of applying an attenuation gain comprised between 0 and 1 and which tends to 1 when the value of the limited current is lower than the ceiling value.

3. A device according to claim 2, wherein the attenuation gain $g_{att}(t)$ satisfies the following relations:

If $|i_{ref}(t)| > i_{max}(t)$ then $g_{att}(t) = i_{max}(t)/|i_{ref}(t)|$

If $|i_{ref}(t)| \leq i_{max}(t)$ then $g_{att}(t) = g_{att}(t - T_s) + k \times (1 - g_{att}(t - T_s))$ where $g_{att}(t-T_s)$ is the value of the attenuation gain at the preceding calculation step, Ts being the time separating two successive calculations;

k is a constant that is included in]0,1[;

$i_{max}(t)$ is the ceiling value for the current;

$i_{ref}(t)$ is the predicted value for the current.

4. A device according to claim 1, wherein said device further comprises, upstream of the calculation assembly for calculating the predicted current, a desired model that is capable of applying a filtering function defining a ratio of the amplitude of a desired signal over the amplitude of the input signal originating from a module as a function of the frequency and in that the desired model is capable of modifying the function based on filtering of the predicted current.

5. A device according to claim 4, wherein the filtering function is configured so that, for the frequencies that are lower than a cut-off frequency, the ratio of the amplitudes is a function converging to zero when the frequency tends to zero and in that the desired model is capable of modifying the cut-off frequency as a function of the predicted current.

6. A device according to claim 4, wherein the desired model includes a filter centered on a predetermined frequency that is capable of decreasing the current in a desired frequency band around the predetermined frequency.

7. A device according to claim 6, wherein the desired model is capable of modifying the gain of the filter as a function of the predicted current.

8. A control device for controlling a loudspeaker in a loudspeaker enclosure, comprising:
an input for an audio signal to be reproduced;
a supply output for supplying an excitation signal for the loudspeaker;
a calculation assembly comprising a set of units, said calculation assembly calculating, at each time instant, at least one predicted current for the excitation signal for the loudspeaker as a function of the audio signal;
wherein said calculation assembly comprises an attenuator that is capable of limiting the predicted current to a limited current value that is lower than a ceiling value by application, to the predicted current, of an attenuation gain which is a function of the predicted current, said attenuator being a unit of the calculation assembly;
wherein the attenuator is capable of applying an attenuation gain comprised between 0 and 1 and which tends to 1 when the value of the limited current is lower than the ceiling value; and
wherein the attenuation gain $g_{att}(t)$ satisfies the following relations:

If $|i_{ref}(t)|>i_{max}(t)$ then $g_{att}(t)=i_{max}(t)/|i_{ref}(t)|$

If $|i_{ref}(t)|\le i_{max}(t)$ then $g_{att}(t)=g_{att}(t-T_s)+k\times(1-g_{att}(t-T_s))$ where $g_{att}(t-T_s)$ is the value of the attenuation gain at the preceding calculation step, Ts being the time separating two successive calculations;

k is a constant that is included in]0,1[;

$i_{max}(t)$ is the ceiling value for the current; and $i_{ref}(t)$ is the predicted value for the current.

9. A control device for controlling a loudspeaker in a loudspeaker enclosure, comprising:
an input for an audio signal to be reproduced;
a supply output for supplying an excitation signal for the loudspeaker;
a calculation assembly comprising a set of units, said calculation assembly calculating, at each time instant, at least one predicted current for the excitation signal for the loudspeaker as a function of the audio signal;
wherein said calculation assembly comprises an attenuator that is capable of limiting the predicted current to a limited current value that is lower than a ceiling value by application, to the predicted current, of an attenuation gain which is a function of the predicted current, said attenuator being a unit of the calculation assembly;
wherein said device includes, upstream of the calculation assembly for calculating the predicted current, a desired model that is capable of applying a filtering function defining a ratio of the amplitude of a desired signal over the amplitude of the input signal originating from a module as a function of the frequency and in that the desired model is capable of modifying the function based on filtering of the predicted current; and
wherein the filtering function is configured so that, for the frequencies that are lower than a cut-off frequency, the ratio of the amplitudes is a function converging to zero when the frequency tends to zero and in that the desired model is capable of modifying the cut-off frequency as a function of the predicted current.

* * * * *